US008710357B2

(12) United States Patent
Wang et al.

(10) Patent No.: US 8,710,357 B2

(45) Date of Patent: Apr. 29, 2014

(54) TRANSPARENT CONDUCTIVE STRUCTURE

(75) Inventors: Yu-Chih Wang, Taichung (TW); Kai-Hsiang Hung, Taichung (TW); Ming-Show Wong, Hualien County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/461,742

(22) Filed: May 1, 2012

(65) Prior Publication Data

US 2013/0104971 A1 May 2, 2013

(30) Foreign Application Priority Data

Nov. 1, 2011 (TW) ................................ 100139718

(51) Int. Cl.
*H01L 31/0224* (2006.01)
*B32B 3/30* (2006.01)

(52) U.S. Cl.
USPC ............................ 136/256; 136/252; 428/152

(58) Field of Classification Search
USPC .................................. 136/256, 252; 428/152
See application file for complete search history.

(56) References Cited

U.S. PATENT DOCUMENTS

| | | | | |
|---|---|---|---|---|
| 4,497,974 | A * | 2/1985 | Deckman et al. | 136/259 |
| 4,554,727 | A * | 11/1985 | Deckman et al. | 438/71 |
| 5,244,509 | A * | 9/1993 | Arao et al. | 136/259 |
| 5,296,045 | A * | 3/1994 | Banerjee et al. | 136/249 |
| 5,453,135 | A * | 9/1995 | Nakagawa et al. | 136/259 |
| 5,549,763 | A * | 8/1996 | Sano et al. | 136/255 |
| 5,589,403 | A * | 12/1996 | Toyama et al. | 438/71 |
| 5,620,530 | A * | 4/1997 | Nakayama | 136/259 |
| 5,977,477 | A * | 11/1999 | Shiozaki | 136/256 |
| 6,043,428 | A * | 3/2000 | Han et al. | 136/263 |
| 6,291,763 | B1 * | 9/2001 | Nakamura | 136/256 |
| 6,297,443 | B1 * | 10/2001 | Nakajima et al. | 136/258 |
| 6,310,282 | B1 * | 10/2001 | Sakurai et al. | 136/263 |
| 6,355,353 | B1 * | 3/2002 | Hyodo et al. | 428/432 |
| 6,365,823 | B1 * | 4/2002 | Kondo | 136/246 |
| 6,384,318 | B1 * | 5/2002 | Nomura | 136/256 |
| 6,433,487 | B1 * | 8/2002 | Yamazaki | 315/169.3 |
| 6,580,026 | B1 * | 6/2003 | Koyanagi et al. | 136/263 |
| 6,683,244 | B2 * | 1/2004 | Fujimori et al. | 136/263 |
| 6,809,252 | B2 | 10/2004 | Winkeler | |
| 6,812,499 | B2 * | 11/2004 | Kondo et al. | 257/95 |
| 6,936,761 | B2 * | 8/2005 | Pichler | 136/256 |
| 7,022,910 | B2 * | 4/2006 | Gaudiana et al. | 136/256 |
| 7,511,217 | B1 * | 3/2009 | Roscheisen et al. | 136/263 |
| 7,875,945 | B2 * | 1/2011 | Krasnov et al. | 257/436 |

(Continued)

OTHER PUBLICATIONS

Takashi Fujibayashi et al., "Improvement in Quantum Efficiency of Thin Film Si Solar Cells Due to the Suppression of Optical Reflectance at Transparent Conducting oxide/Si Interface by $TiO_2$/ZnO Antireflection Coating," Applied Physics Letters, 2006, pp. 183508-1-183508-3, vol. 88, American Institute of Physics, US.

(Continued)

*Primary Examiner* — Golam Mowla

(57) ABSTRACT

A transparent conductive structure is disclosed, including a first transparent conductive layer and a second transparent conductive layer on the first transparent conductive layer, wherein the first transparent conductive layer has a textured structure including wave crests and wave troughs and the second layer has an asymmetric thickness on inclined planes of the wave crests an the wave troughs of the first transparent conductive layer.

24 Claims, 12 Drawing Sheets incident sunlight

702

704

706

708

(56) References Cited

U.S. PATENT DOCUMENTS

| | | | | |
|---|---|---|---|---|
| 7,888,594 | B2 | 2/2011 | Lu et al. | |
| 2001/0029978 | A1* | 10/2001 | Nakai et al. | 136/258 |
| 2002/0011263 | A1* | 1/2002 | Muramoto et al. | 136/255 |
| 2002/0040728 | A1* | 4/2002 | Yoshikawa | 136/263 |
| 2002/0050289 | A1* | 5/2002 | Wada et al. | 136/256 |
| 2002/0117661 | A1* | 8/2002 | Kondo et al. | 257/21 |
| 2005/0016583 | A1* | 1/2005 | Blieske et al. | 136/256 |
| 2005/0039788 | A1* | 2/2005 | Blieske et al. | 136/246 |
| 2006/0043517 | A1* | 3/2006 | Sasaki et al. | 257/458 |
| 2006/0065299 | A1 | 3/2006 | Fukawa et al. | |
| 2006/0090790 | A1* | 5/2006 | Kobayashi et al. | 136/256 |
| 2006/0137735 | A1* | 6/2006 | Kobayashi et al. | 136/246 |
| 2006/0266411 | A1* | 11/2006 | Sugiyama et al. | 136/263 |
| 2007/0151596 | A1* | 7/2007 | Nasuno et al. | 136/256 |
| 2008/0047602 | A1 | 2/2008 | Krasnov | |
| 2008/0163917 | A1* | 7/2008 | Rech et al. | 136/244 |
| 2008/0185036 | A1* | 8/2008 | Sasaki et al. | 136/252 |
| 2008/0196761 | A1* | 8/2008 | Nakano et al. | 136/258 |
| 2009/0194157 | A1* | 8/2009 | den Boer et al. | 136/256 |
| 2009/0320910 | A1* | 12/2009 | Matsui et al. | 136/252 |
| 2010/0132792 | A1 | 6/2010 | Kim et al. | |
| 2010/0200059 | A1 | 8/2010 | Lu et al. | |
| 2010/0269897 | A1* | 10/2010 | Sakai et al. | 136/255 |
| 2011/0056557 | A1 | 3/2011 | Park et al. | |
| 2012/0012168 | A1* | 1/2012 | Goya et al. | 136/255 |

OTHER PUBLICATIONS

Mika Kambe et al., "$TiO_2$-Coated Transparent Conductive Oxide ($SnO_2$:F) Films Prepared by Atmospheric Pressure Chemical Vapor Deposition with High Durability against Atomic Hydrogen," Japanese Journal of Applied Physics, 2006, pp. L291-L293, vol. 45, No. 10, The Japan Society of Applies Physics, Japan.

H. Natsuhara et al., "Hydrogent-Radical Durability of $TiO_2$ Thin Films for Protecting Transparent Conducting Oxide for Si Thin Film Solar Cells," Thin Solid Films, 2003, pp. 253-256, vol. 430, Elsevier, US.

Sameer Chhajed et al., "Nanostructured Multilayer Graded-Index Antireflection Coating for Si Solar Cells with Broadband and Omnidirectional Characteristics," Applied Physics Letters, 2008, pp. 251108-1-251108-3, vol. 93, American Institute of Physics, US.

Jin-A Jeong et al., "Thickness Effect of RF Sputtered $TiO_2$ Passivating Layer on the Performance of Dye-Sensitized Solar Cells," Solar Energy Materials & Solar Cells, Feb. 2010, pp. 344-348, vol. 95, Elsevier, US.

K.-H. Hung et al., "Glancing Angle Deposited Sculptured Titania Films for Light Scattering Enhancement in Solar Cells," International Conference on Mtallurgical Coatings & Thin Films, May 2011, 2 pages, US.

* cited by examiner

TRANSPARENT CONDUCTIVE STRUCTURE

CROSS REFERENCE TO RELATED APPLICATIONS

This application claims priority of Taiwan Patent Application No. 100139718, filed on Nov. 1, 2011, the entirety of which is incorporated by reference herein.

BACKGROUND

1. Technical Field

The technical field relates to a transparent conductive layer structure and more particularly to a transparent conductive layer structure of a solar cell.

2. Description of the Related Art

Solar cells have become an important research topic in the energy field sector.

Solar cells can be assembled on buildings, such as houses, moving apparatuses such as cars and portable electronic devices to convert sunlight into electronic energy.

A transparent conductive oxide (TCO) is widely used as a front electrode of a thin film solar cell. A TCO having a rough surface can scatter incident sunlight and thus increase light path of photons in an active layer of a solar cell. The conventional solar cell in accordance with the front electrode formed of TCO is required to be improved.

SUMMARY

The disclosure provides a transparent conductive layer structure, comprising a first transparent conductive layer, wherein the first transparent conductive layer has a textured structure including wave crests and wave troughs; and a second transparent conductive layer disposed on the first transparent conductive layer, wherein the second transparent conductive layer has an asymmetric thickness on inclined planes of the wave crests or the wave troughs of the first transparent conductive layer.

BRIEF DESCRIPTION OF DRAWINGS

The disclosure can be more fully understood by reading the subsequent detailed description and examples with references made to the accompanying drawings, wherein.

DETAILED DESCRIPTION

Figure 1A:
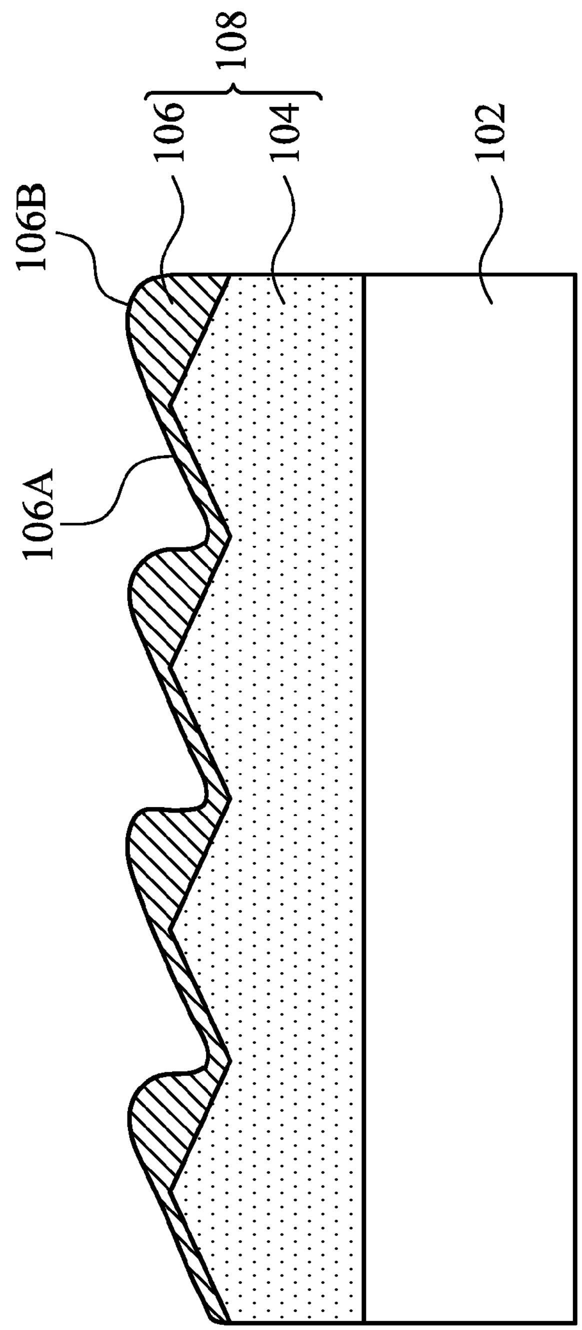
FIG. 1A shows a cross-section comprising a first transparent conductive structure which has a textured structure including wave crests and wave troughs, and a second layer which has an asymmetric thickness on inclined planes of the wave crests or the wave troughs of the first transparent conductive layer.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
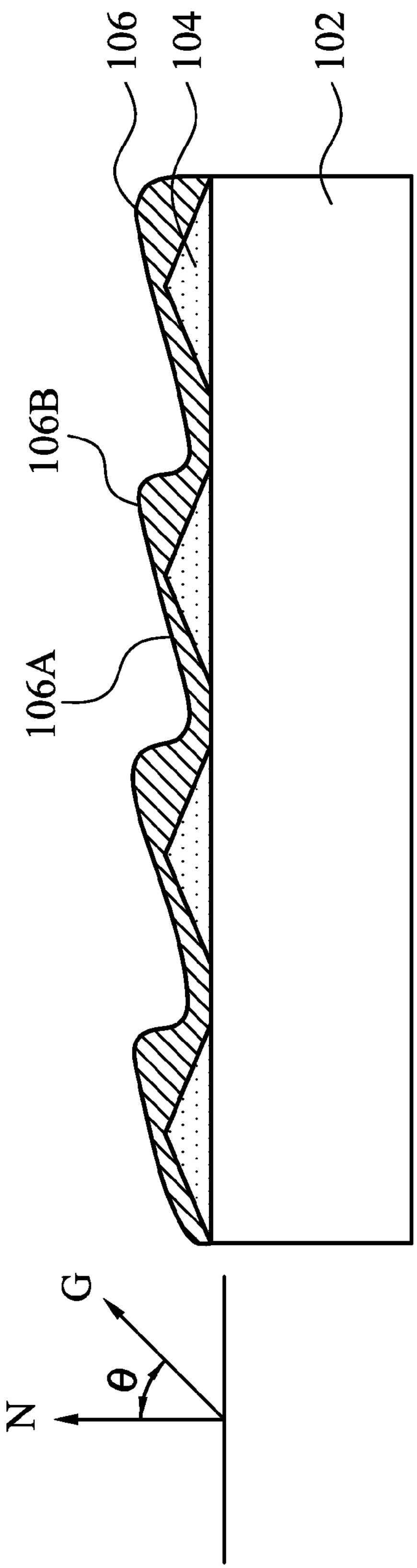
FIG. 1B shows a cross-section comprising a first transparent conductive layer which is piecemeal and has a profile as pyramids including wave crests and wave troughs, and a second layer which has an asymmetric thickness on inclined planes of the wave crests or the wave troughs of the first transparent conductive layer.
Figure 1C:
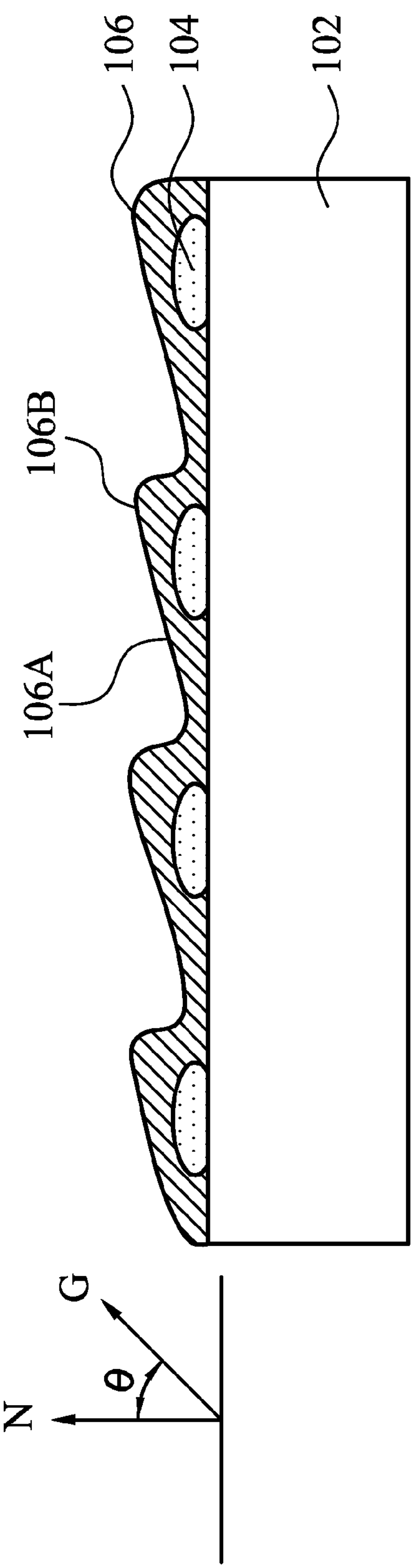
FIG. 1C shows a cross-section comprising a first transparent conductive layer which is piecemeal and has a profile as spheres or islands including wave crests and wave troughs, spheres or islands and a second layer which has an asymmetric thickness on inclined planes of the wave crests or the wave troughs of the first transparent conductive layer.

A structure of a solar cell having a front electrode of an embodiment of the disclosure is illustrated in accordance with FIG. 1A. Referring to FIG. 1A, a substrate 102 is provided, wherein the substrate 102 can be a glass, a metal, a semiconductor or a plastic substrate. The semiconductor can be silicon, cadmium antimonide, copper indium selenide, copper indium gallium selenide or gallium arsenide. The substrate 102 preferably is a transparent substrate, such as glass. A front electrode 108 comprising a first transparent conductive layer 104 and a second transparent conductive layer 106 is disposed on the substrate 102, wherein the first transparent conductive layer 104 includes a textured structure comprising wave crests and wave troughs. In an embodiment of the disclosure, the first transparent conductive layer 104 is a metal oxide or a metal oxide doped with dopants, such as $SnO_2$, $SnO_2$ doped with F or Ta, ZnO, $In_2O_3$, $TiO_2$, $Al_2O_3$ or $Zr_2O$. The first transparent conductive layer 104 has a thickness of about 200 nm~2000 nm and preferably has a thickness of about 500 nm~1500 nm. In the visible light range (having wavelengths of between 400 nm and 800 nm), the first transparent conductive layer 104 preferably has an optical transmittance larger than 70% and more preferably has an optical transmittance larger than 80%~95%, and has a refractive index of 1.8~2.2. The surface roughness of the first transparent conductive layer 104 preferably is 10 nm~200 nm and more preferably is 20 nm~200 nm. The sheet resistance of the first transparent conductive layer 104 preferably is less than 30 ohm/sq. As shown in FIG. 1B, the first transparent conductive layer 104 can have a profile as a pyramids. In this embodiment, each of the pyramids has higher positions and lower positions, wherein the higher positions can be defined as wave crests and the lowest positions can be defined as wave troughs. Accordingly, the first transparent conductive layer 104 having a profile as pyramids includes wave crests and wave troughs. Alternatively, as shown in FIG. 1C, the first transparent conductive layer 104 can have a profile as spheres or islands. Likewise, each of the spheres or islands has higher positions and lower positions, wherein the higher positions can be defined as wave crests and the lowest positions can be defined as wave troughs. Accordingly, the first transparent conductive layer 104 having a profile as spheres or islands includes wave crests and wave troughs. In an embodiment, a distance between two spheres or islands of the first transparent conductive layer 104 can be 1 nm~5000 nm and preferably is 10 nm~1000 nm.

A second transparent conductive layer 106 having an asymmetric thickness is disposed on opposite sides of the wave crests or the wave troughs of the first transparent conductive layer 104. The second transparent conductive layer 106 can be formed by glancing angle deposition (GLAD), wherein the growth direction of the second transparent conductive layer 106 is not parallel with a normal line to a surface of the substrate 102. The textured structure including wave crests and wave troughs or including island-arranged structure generates a shadowing effect. Therefore, according to the glancing angle deposition (GLAD), the second transparent conductive layer 106 can form a specific structure having an asymmetric thickness. The structure of the second transparent conductive layer 106 is illustrated in more detail in accordance with FIG. 1A. The second transparent conductive layer 106 has portions with different thicknesses on of wave crests or wave troughs of the first transparent conductive layer 104, wherein the thinner portion 106A to the thicker portion 106B is a ratio of 1:10~5:10, and preferably is a ratio of 1:10~3:10. Therefore, the second transparent conductive layer 106 disposed on the first transparent conductive layer 104 presents an asymmetric thickness. Growth direction of crystal columns of the second transparent conductive layer 106 is not parallel to a normal line to the first transparent conductive layer 104. In a preferable embodiment of the disclosure, an angle $\theta$ between the growth direction (G) of the crystal columns of the second transparent conductive layer 106 and a normal line (N) to the first transparent conductive layer 104 is 5°~90°. In a more preferable embodiment of the disclosure, an angle $\theta$ between growth direction (G) of crystal columns of the second transparent conductive layer 106 and a normal line (N) to the first transparent conductive layer 104 is 30°~86.

Figure 9:
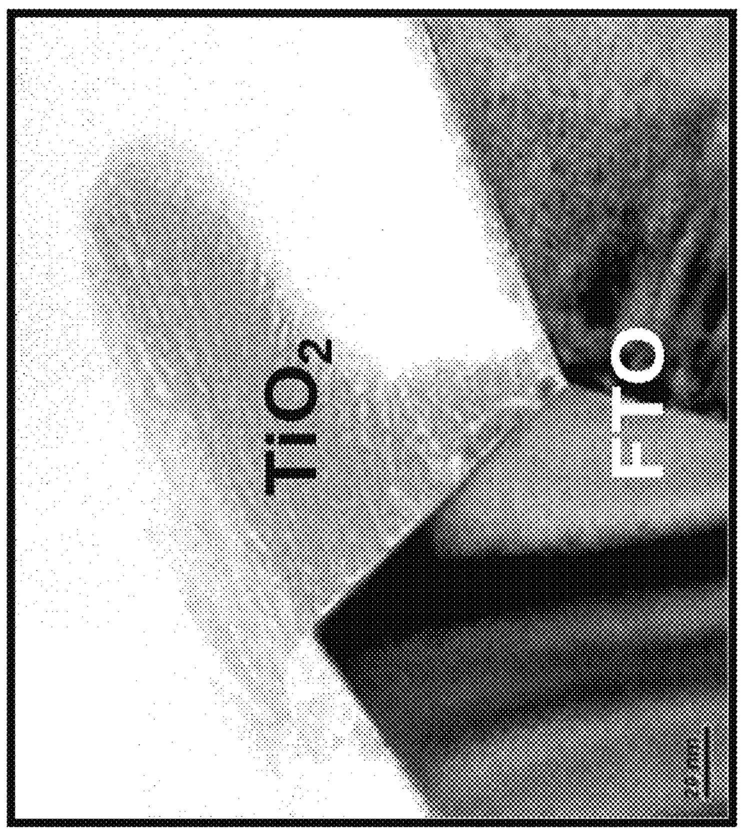
FIG. 9 shows a transmission electron microscopy (TEM) picture including the second transparent conductive layer grown on the first transparent conductive layer, wherein the first transparent conductive layer is F-doped $SnO_2$ (FTO) comprising wave crests and wave trough; and a second layer ($TiO_2$) disposed on the first transparent conductive layer, wherein the second layer has an asymmetric thickness on inclined planes of the wave crests or the wave troughs of the first transparent conductive layer.

FIG. 9 shows a transmission electron microscopy (TEM) picture including the second transparent conductive layer 106 grown on the first transparent conductive layer 104, wherein the first transparent conductive layer 104 is F-doped $SnO_2$ (FTO) and the second transparent conductive layer 106 is $TiO_2$. FIG. 9 shows that the textured structure including wave crests and wave troughs generates a shadowing effect, thus the second transparent conductive layer 106 is formed as a specific structure having an asymmetric thickness on inclined planes of the wave crests and wave troughs on the first transparent conductive layer 104.

The second transparent conductive layer 106 can be formed by a metal oxide or a metal oxide doped with dopants, such as $TiO_2$ doped with dopants $\alpha$, wherein the dopants $\alpha$ can be Ag, Al, B, C, F, Ga, H, In, Nb, Ta, V or W. Further, the second transparent conductive layer 106 can also be $SnO_2$ doped with F or Ta, or ZnO doped with dopants $\beta$, wherein the dopants $\beta$ can include Ag, Al, B, C, F, Ga, H, In, Nb, Ta, V or W. In another embodiment of the disclosure, the second transparent conductive layer 106 can be $CuAlO_2$. In yet another embodiment of the disclosure, the second transparent conductive layer 106 can be metal nitrides, such as TiN, or nano-scale metals, such as Ag, Cu, Al, In or Au, or metal alloy. In an embodiment of the disclosure, the second transparent conductive layer 106 has a higher durability against hydrogen plasma than the first transparent conductive layer 104.

Figure 2A:
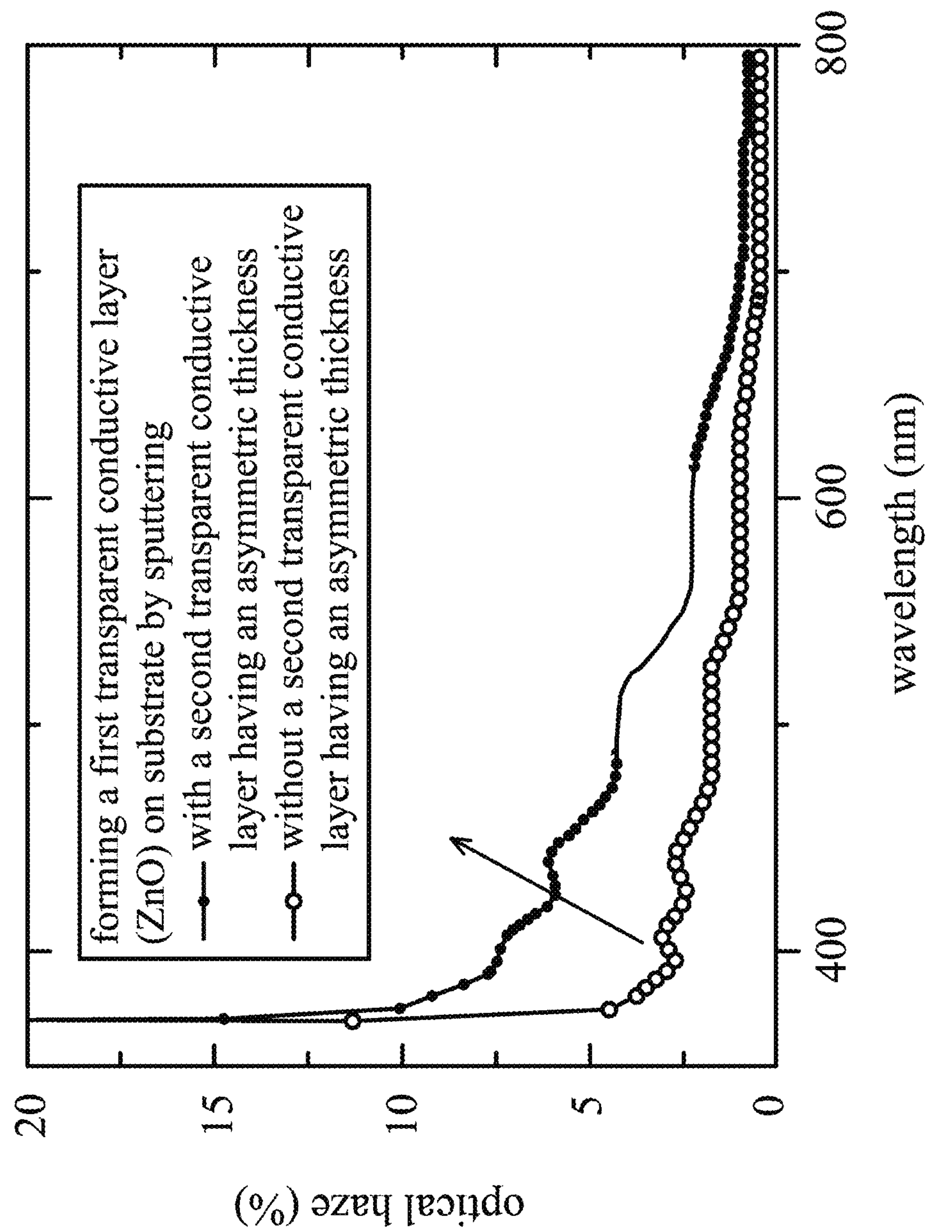
FIG. 2A shows a curve diagram with comparison of optical haze between the condition where a first transparent conductive layer (ZnO) is formed by sputtering with a second transparent conductive layer having an asymmetric thickness thereon and the condition without the second transparent conductive layer.
Figure 2B:
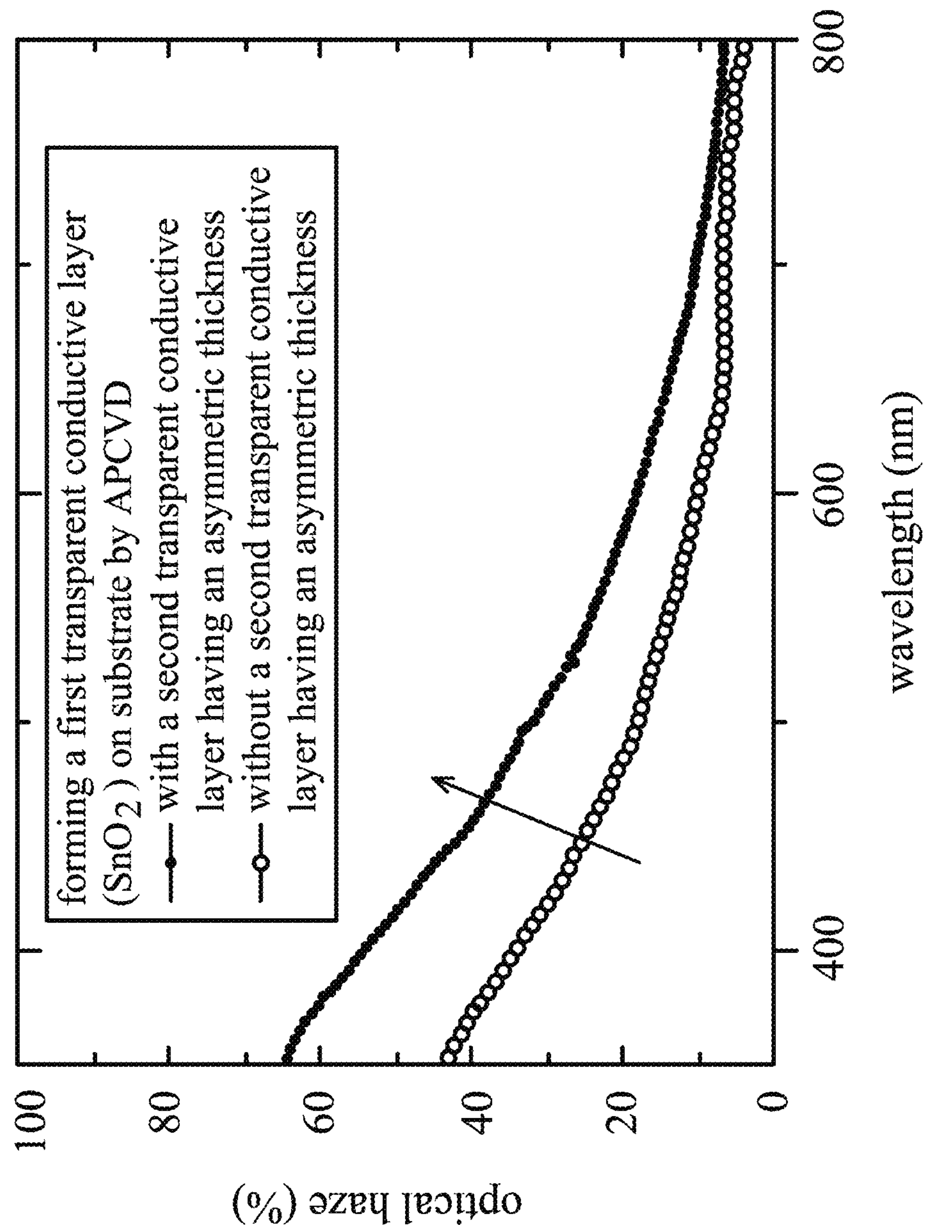
FIG. 2B shows a curve diagram with comparison of optical haze between the condition where a first transparent conductive layer ($SnO_2$) is formed by APVCD with a second transparent conductive layer having an asymmetric thickness thereon and the condition without the second transparent conductive layer.

The second transparent conductive layer 106 preferably has a thickness ranging from 5 nm to 500 nm, and more preferably has a thickness ranging from 10 nm to 200 nm. When the second transparent conductive layer 106 is formed of metal or metal alloy, it preferably has a thickness ranging from 1 nm to 50 nm, and more preferably has a thickness ranging from 1 nm to 20 nm. In a preferable embodiment of the disclosure, the second transparent conductive layer 106 is formed of $TiO_2$ and has an anatase crystal structure or is a mixture of an anatase structure and an amorphous structure. In a preferable embodiment of the disclosure, the second transparent conductive layer 106 is formed of $TiO_2$ and primarily has a crystal orientation of (101) or (004). In a more preferable embodiment of the disclosure, the second transparent conductive layer 106 primarily has a crystal orientation of (101). In a preferable embodiment of the disclosure, the second transparent conductive layer 106 is formed of materials having a high work function. The work function of the second transparent conductive layer 106 can be 4.8-7 eV, and the work function of the second transparent conductive layer 106 preferably is greater than the work function of the first transparent conductive layer 104. In visible light with a wavelength ranging from 400 to 800 nm, a refractive index of the second transparent conductive layer 106 is 1.4~2.7 and an average optical transmittance of the second transparent conductive layer 106 is 80~95%. In a preferable embodiment of the disclosure, the second transparent conductive layer 106 has a higher durability against hydrogen plasma than the first transparent conductive layer 104. In an embodiment of the disclosure, the root mean square (RMS) roughness of a surface of the second transparent conductive layer 106 is 10 nm~500 nm, and the root mean square (RMS) roughness of a surface of the second transparent conductive layer 106 is preferably is 20 nm~200 nm. FIG. 2A shows a comparison of optical haze between the structure with a first transparent conductive layer (ZnO) formed by sputtering having a second transparent conductive layer having an asymmetric thickness thereon and the structure without the second transparent conductive layer. FIG. 2B shows a comparison of optical haze between the structure with a first transparent conductive layer ($SnO_2$) formed by APVCD having a second transparent conductive layer having an asymmetric thickness thereon and the structure without the second transparent conductive layer. According to the table 1 below and the FIGS. 2A and 2B, wherein a second transparent conductive layer having an asymmetric thickness is formed on the first transparent conductive layer formed of ZnO and a second transparent conductive layer having an asymmetric thickness is formed on the first transparent conductive layer formed of $SnO_2$, an increased haze is obtained, and optical scattering of the first transparent conductive layer is effectively improved and the optical path length of photons in an active layer of the solar cell is increased. With the formation of the second transparent conductive layer formed on the first transparent conductive layer formed of ZnO, optical haze increased from 1.24% to 2.74%. With the formation of the second transparent conductive layer formed on the first transparent conductive layer formed of $SnO_2$, optical haze increased from 12.99% to 21.7%.

TABLE 1

| | optical haze at wavelength 400~800 nm | | |
|---|---|---|---|
| first transparent conductive layer | without a second transparent conductive layer | with a second transparent conductive layer having an asymmetric thickness | increase of haze |
| ZnO formed by sputtering | 1.24 | 2.74 | 120.2% |
| $SnO_2$ formed by APCVD | 12.99 | 21.7 | 67% |

Figure 3:
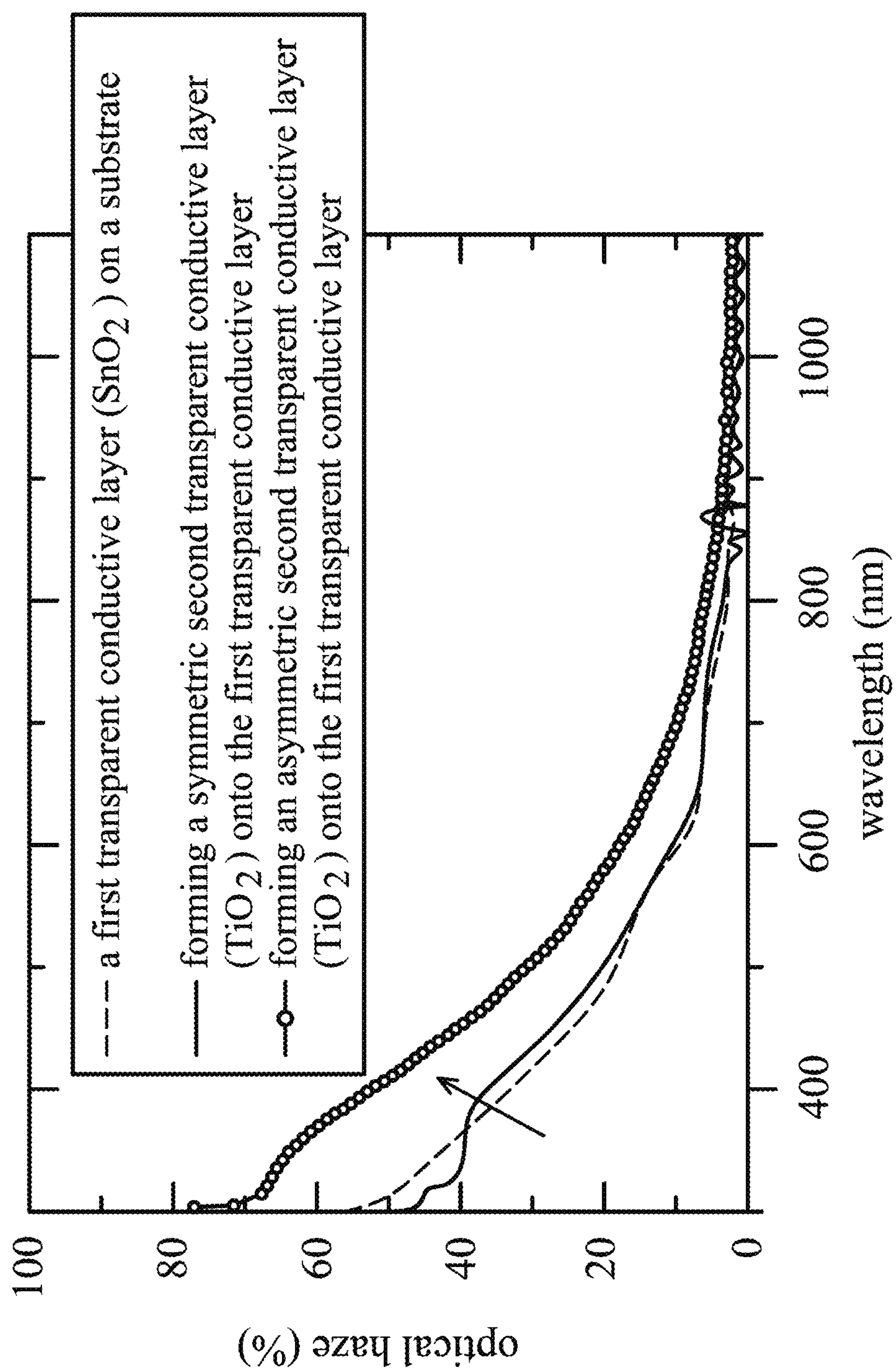
FIG. 3 shows a curve diagram with optical haze as a function of wavelength to compare three structures of the disclosure.

FIG. 3 shows a curve diagram with optical haze as a function of wavelength to compare three structures of the disclosure, wherein the first structure only has a first transparent conductive layer ($SnO_2$) with wave crests and wave troughs on a glass substrate, the second structure comprises a second transparent conductive layer with a symmetrical thickness on the first transparent conductive layer, and the third structure comprises a second transparent conductive layer with an asymmetric thickness on the first transparent conductive layer. As shown in FIG. 3, the structure comprising the second transparent conductive layer with the symmetrical thickness on the first transparent conductive layer can not significantly improve optical haze. On the contrary, the structure comprising the second transparent conductive layer with an asymmetric thickness on the first transparent conductive layer can significantly improve optical haze.

In addition, glancing angle deposition (GLAD) can adjust the refractive index (n value) of the second transparent conductive layer. The second transparent conductive $TiO_2$ layer, an anatase crystal structure, has a refractive index (n value) of about 2.4~2.6. The first transparent conductive layer formed of $SnO_2$ or ZnO has a refractive index (n value) of about 1.8~2.2. Therefore, formation of the second transparent conductive layer can reduce the refractive index difference between air and the first transparent conductive layer to reduce reflection of incident light at the interface between the glass and the transparent conductive layer. In an another aspect, the second transparent conductive layer formed of $TiO_2$ has a higher work function (about 6.2 eV) such that it can provide better ohmic contact to a p-type semiconductor to enhance carrier transportation.

Figure 4:
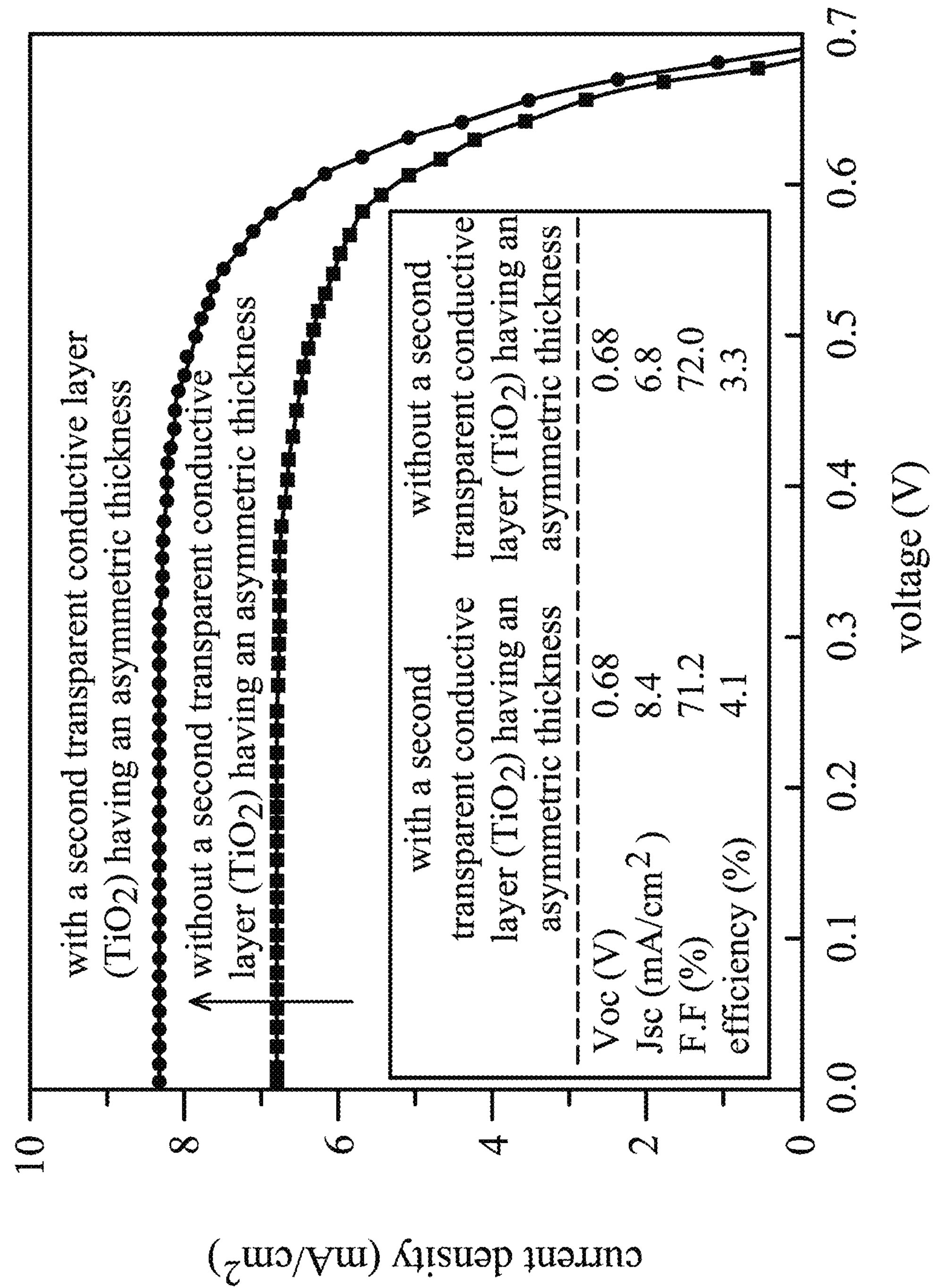
FIG. 4 shows a curve diagram with current density as a function of voltage to compare two conditions of a dye-sensitized solar cell (DSSC).

FIG. 4 shows a curve diagram with current density as a function of voltage to compare two structures of a dye-sensitized solar cell (DSSC), wherein the first structure does not include a second transparent conductive layer, and the second structure includes a second transparent conductive layer having an asymmetric thickness. As shown in FIG. 4, the structure comprising the second transparent conductive layer with an asymmetric thickness on the first transparent conductive layer significantly improved the current density of the dye-sensitized solar cell (DSSC), wherein the current density improved from 6.8 $mA/cm^2$ to 8.4 $mA/cm^2$, and photo-electron conversion efficiency increased from 3.3% to 4.1%.

Figure 5:
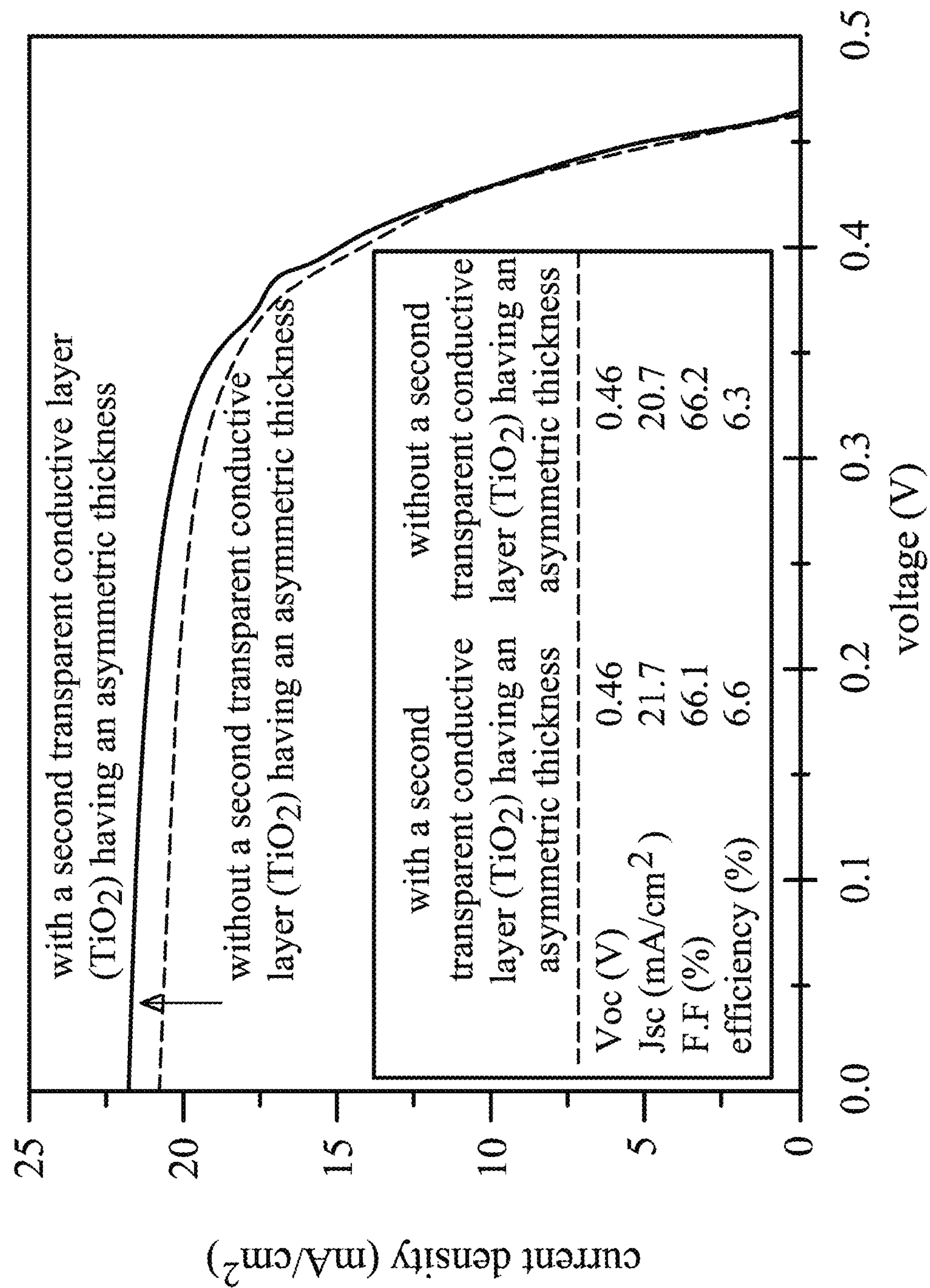
FIG. 5 shows a curve diagram with current density as a function of voltage to compare two conditions of a microcrystalline silicon thin film solar cell.

FIG. 5 shows a curve diagram with current density as a function of voltage to compare two conditions of a microcrystalline silicon thin film solar cell, wherein the first condition does not include a second transparent conductive layer, and the second condition includes a second transparent conductive layer having an asymmetric thickness. As shown in FIG. 5, the structure comprising a second transparent conductive layer with an asymmetric thickness on the first transparent conductive layer can significantly improve the current density of the microcrystalline silicon thin film solar cell, wherein the current density is improved from 20.7 $mA/cm^2$ to 21.7 $mA/cm^2$, and photo-electron conversion efficiency is increased from 6.3% to 6.6%.

Figure 6:
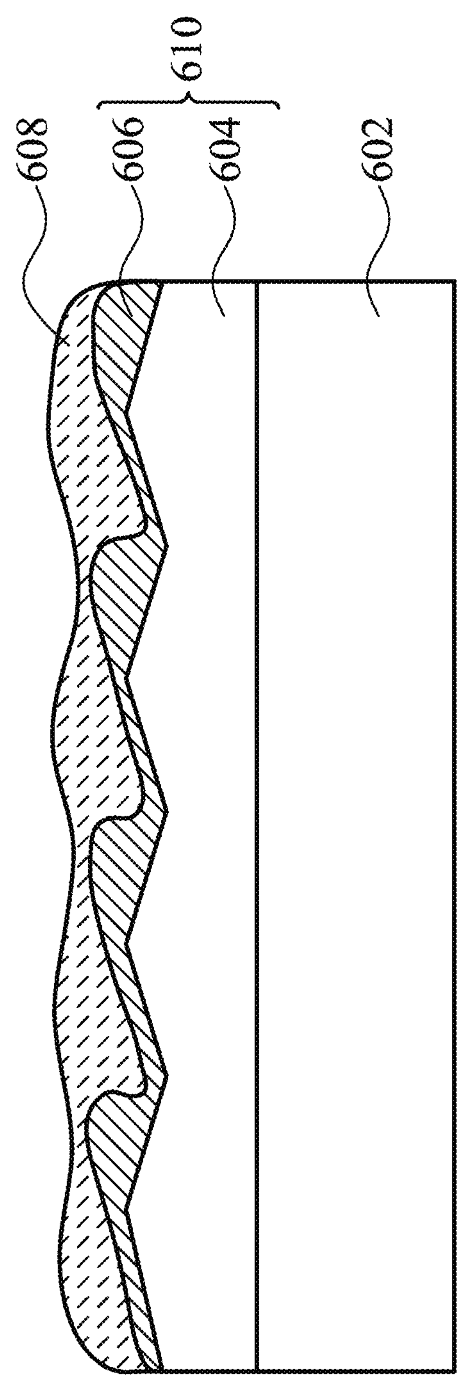
FIG. 6 shows a cross-section comprising a first transparent conductive layer, a second transparent conductive layer and a third transparent conductive layer of an embodiment of the disclosure.

A solar cell structure having a front electrode of another embodiment of the disclosure is illustrated in accordance with FIG. 6. Referring to FIG. 6, a substrate 602 is provided, wherein the substrate 602 can be a glass. A front electrode 610 comprising a first transparent conductive layer 604 and a second transparent conductive layer 606 is disposed on the substrate 602, wherein the first transparent conductive layer 604 includes a textured structure comprising wave crests and wave troughs. In an embodiment of the disclosure, the first transparent conductive layer 604 is a metal oxide or a metal oxide doped with dopants, such as $SnO_2$, $SnO_2$ doped with F or Ta, ZnO, $In_2O_3$, $TiO_2$, $Al_2O_3$ or $Zr_2O$. The first transparent conductive layer 604 has a thickness of about 200 nm~2000 nm and preferably has a thickness of about 500 nm~1500 nm. In the visible light range (having wavelengths from 400 nm to 800 nm), the first transparent conductive layer 604 preferably has an optical transmittance larger than 70% and has a refractive index of 1.8~2.2. The surface roughness of the first transparent conductive layer 604 preferably is 10 nm~200 nm, and more preferably is 20 nm~200 nm and most preferably is 20 nm~50 nm.

A second transparent conductive layer 606 having an asymmetric thickness is disposed on the first transparent conductive layer 604. The second transparent conductive layer 606 can be formed by glancing angle deposition (GLAD). The textured structure including wave crests and wave troughs or including an island-arranged structure generates shadowing effect. Therefore, according to the glancing angle deposition (GLAD), the second transparent conductive layer 606 can form a specific structure having an asymmetric thickness.

A third transparent conductive layer 608 having an asymmetric thickness is disposed on the second transparent conductive layer 606. In a preferable embodiment of the disclosure, the third transparent conductive layer 608 includes a first portion and a second portion, wherein the first portion is disposed on the portion of the second transparent conductive layer 606 having a thinner thickness and the second portion is disposed on the portion of the second transparent conductive layer 606 having a thicker thickness, and the first portion is thicker than the second portion to improve overall flatness of the transparent conductive structure. The third transparent conductive layer 608 is a metal oxide or a metal oxide doped with dopants, such as $SnO_2$, $SnO_2$ doped with F or Ta, ZnO, $In_2O_3$, $TiO_2$, $Al_2O_3$ or $Zr_2O$.

Figure 7:
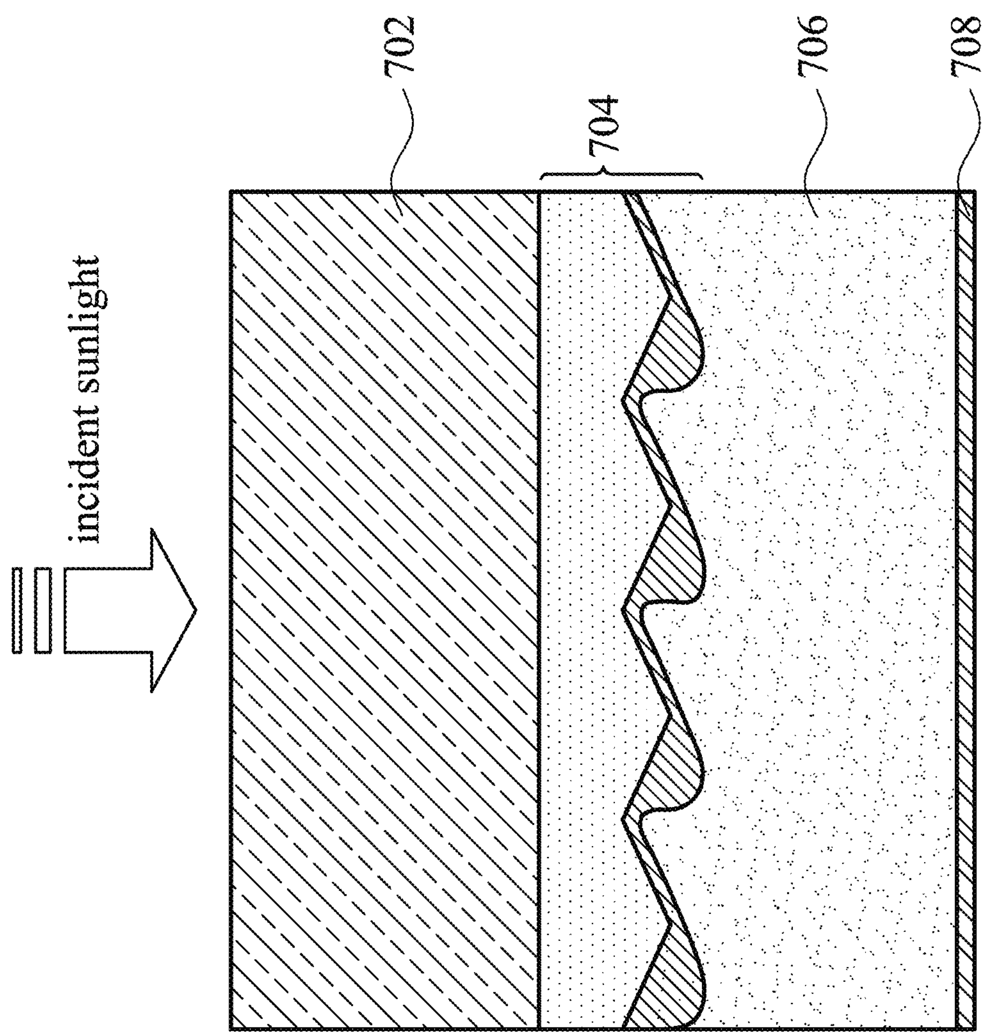
FIG. 7 shows a cross-section of a solar cell of an embodiment of the disclosure.
Figure 8:
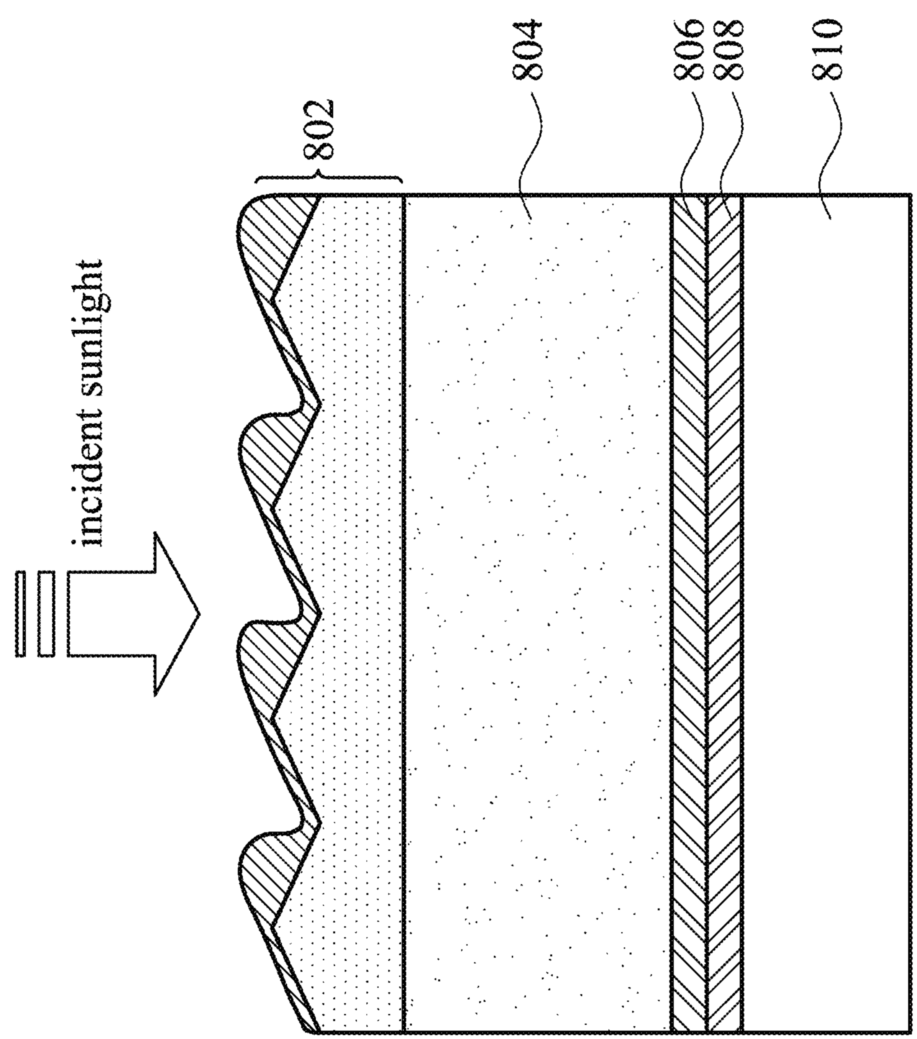
FIG. 8 shows a cross-section of a solar cell of another embodiment of the disclosure.

The front electrode comprising the second transparent conductive layer with an asymmetric thickness formed by the method described can be used in a superstrate-structure thin film solar cell. As shown in FIG. 7, the superstrate-structure thin film solar cell comprises a substrate 702, a front electrode 704, an active layer 706 and a back electrode 708. In addition, the front electrode comprising the second transparent conductive layer with an asymmetric thickness formed by the method described can be used in a substrate-structure thin film solar cell. As shown in FIG. 8, the substrate-structure thin film solar cell comprises a front electrode 802, an active layer 804, a metal electrode 806, an insulating layer 808 and an opaque substrate 810. In the substrate structure thin film solar cell, the front electrode 802 has behaviors of transparency and electrical conductivity, and the second transparent conductive layer has an anti-reflection property. However, the disclosure is not limited to the aforementioned thin film solar cell. The disclosure can be applied to any solar cell comprising a front electrode.

While the disclosure has been described by way of example and in terms of the preferred embodiments, it is to be understood that the disclosure is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transparent conductive layer structure, comprising:

a first transparent conductive layer, wherein the first transparent conductive layer has a textured structure comprising wave crests and wave troughs; and a second transparent conductive layer disposed on the first transparent conductive layer, wherein the second transparent conductive layer has an asymmetric thickness on inclined planes of the wave crests or the wave troughs of the first transparent conductive layer, and the second transparent conductive layer has portions including a thinner portion and a thicker portion with different thicknesses on opposite sides of wave crests or wave troughs of the first transparent conductive layer, wherein the thinner portion to the thicker portion is a ratio of 1:10~5:10.

2. The transparent conductive layer structure as claimed in claim 1, wherein the thinner portion to the thicker portion is a ratio of 1:10~3:10.

3. The transparent conductive layer structure as claimed in claim 1, wherein the second transparent conductive layer comprises a metal oxide or a metal oxide doped with dopants.

4. The transparent conductive layer structure as claimed in claim 3, wherein the second transparent conductive layer comprises $TiO_2$ doped with dopants $\alpha$, wherein the dopants $\alpha$ including Ag, Al, B, C, F, Ga, H, In, Nb, Ta, V or W.

5. The transparent conductive layer structure as claimed in claim 4, wherein the second transparent conductive layer is an anatase crystal structure or is a mixture of an anatase structure and an amorphous structure.

6. The transparent conductive layer structure as claimed in claim 4, wherein the second transparent conductive layer primarily has a crystal orientation of (101) or (004).

7. The transparent conductive layer structure as claimed in claim 3, wherein the second transparent conductive layer is ZnO or ZnO doped with dopants $\beta$, wherein the dopants $\beta$ including Ag, Al, B, C, F, Ga, H, In, Nb, Ta, V or W.

8. The transparent conductive layer structure as claimed in claim 3, wherein the second transparent conductive layer is $SnO_2$ doped with F or Ta.

9. The transparent conductive layer structure as claimed in claim 1, wherein the second transparent conductive layer comprises a metal nitride.

10. The transparent conductive layer structure as claimed in claim 9, wherein the second transparent conductive layer comprises TiN.

11. The transparent conductive layer structure as claimed in claim 1, wherein the second transparent conductive layer comprises a metal or a metal alloy.

12. The transparent conductive layer structure as claimed in claim 11, wherein the second transparent conductive layer comprises Ag, Cu, Al, In or Au.

13. The transparent conductive layer structure as claimed in claim 1, wherein the work function of the second transparent conductive layer is 4.8~7 eV.

14. The transparent conductive layer structure as claimed in claim 1, wherein the second transparent conductive layer has a higher durability against hydrogen plasma than the first transparent conductive layer.

15. The transparent conductive layer structure as claimed in claim 1, wherein in a visible light with a wavelength ranging from 400 to 800 nm, a refractive index of the second transparent conductive layer is 1.4~2.7.

16. The transparent conductive layer structure as claimed in claim 1, wherein in a visible light with a wavelength ranging from 400 to 800 nm, an average optical transmittance of the second transparent conductive layer is 80~95%.

17. The transparent conductive layer structure as claimed in claim 1, wherein the first transparent conductive layer comprises $SnO_2$, $SnO_2$ doped with F or Ta, ZnO, $In_2O_3$, $TiO_2$, $Al_2O_3$ or $Zr_2O$.

18. The transparent conductive layer structure as claimed in claim 1, further comprising a third transparent conductive layer disposed on the second transparent conductive layer, wherein the third transparent conductive layer directly contacts the second transparent layer.

19. The transparent conductive layer structure as claimed in claim 18, wherein the third transparent conductive layer is a structure having an asymmetric thickness.

20. The transparent conductive layer structure as claimed in claim 19, wherein the third transparent conductive layer includes a first portion and a second portion, wherein the first portion is disposed on a portion of the second transparent conductive layer having a thinner thickness and the second portion is disposed on a portion of the second transparent conductive layer having a thicker thickness, and the first portion is thicker than the second portion.

21. The transparent conductive layer structure as claimed in claim 20, wherein the third transparent conductive layer comprises $SnO_2$, $SnO_2$ doped with F or Ta, ZnO, $In_2O_3$, $TiO_2$, $Al_2O_3$ or $Zr_2O$.

22. The transparent conductive layer structure as claimed in claim 1, wherein the first transparent conductive layer and the second transparent conductive layer constitute an electrode layer of a solar cell.

23. The transparent conductive layer structure as claimed in claim 4, wherein the second transparent conductive layer has a thickness ranging from 10 nm to 200 nm.

24. The transparent conductive layer structure as claimed in claim 1, wherein an angle between growth direction of crystal columns of the second transparent conductive layer and a normal line to the first transparent conductive layer is 30°~86°.

* * * * *